(12) United States Patent
Silverman

(10) Patent No.: US 6,908,713 B2
(45) Date of Patent: Jun. 21, 2005

(54) EUV MASK BLANK DEFECT MITIGATION

(75) Inventor: Peter J. Silverman, Palo Alto, CA (US)

(73) Assignee: Intel Corporation, Santa Clara, CA (US)

(*) Notice: Subject to any disclaimer, the term of this patent is extended or adjusted under 35 U.S.C. 154(b) by 168 days.

(21) Appl. No.: 10/359,421

(22) Filed: Feb. 5, 2003

(65) Prior Publication Data
US 2004/0151988 A1 Aug. 5, 2004

(51) Int. Cl.[7] ............................................. G01F 9/00
(52) U.S. Cl. ........................................................ 430/5
(58) Field of Search ............................ 430/5, 311–313; 378/35

(56) References Cited

U.S. PATENT DOCUMENTS 5,928,817 A * 7/1999 Yan et al. ..................... 430/5

* cited by examiner

Primary Examiner—S. Rosasco
(74) Attorney, Agent, or Firm—Michael Plimier

(57) ABSTRACT

A solution for mitigating the effects of EUV substrate surface defects is disclosed. In one embodiment, a layer of polyimide material is formed upon a mask substrate surface, resulting in a substantially defect free surface adjacent to which a reflective multilayer may be positioned for EUV lithography. To reduce the possibility of polyimide outgassing and resultant added roughness to adjacently positioned layers, the layer of polyimide may be cured in a vacuum at an elevated temperature before other layers are adjacently positioned.

20 Claims, 6 Drawing Sheets

US 6,908,713 B2

EUV MASK BLANK DEFECT MITIGATION

BACKGROUND OF THE INVENTION

Extreme ultraviolet (EUV) lithography, which is based upon exposure with the portion of the electromagnetic spectrum having a wavelength of 10–15 nanometers, can be used to print features with smaller critical dimension (CD) than other more conventional techniques, such as those utilizing deep ultraviolet (DUV) radiation. For example, an EUV scanner may use 4 imaging mirrors and a Numerical Aperture (NA) of 0.10 to achieve a CD of 50–70 nm with a depth of focus (DOF) of about 1.00 micrometer (um). Alternatively, an EUV scanner may use 6 imaging mirrors and a NA of 0.25 to print a CD of 20–30 nm although the DOF will be reduced to about 0.17 um.

Masking and reflection of EUV radiation brings about a unique set of challenges generally not encountered with DUV radiation. For example, a mask for DUV lithography is transmissive, and layers of materials such as chrome and quartz may be used to effectively mask or transmit, respectively, DUV radiation. Thus, a desired pattern on a DUV mask may be defined by selectively removing an opaque layer, such as chrome, to uncover portions of an underlying transparent substrate, such as quartz. However, virtually all condensed materials absorb at the EUV wavelength, so a mask for EUV lithography is reflective, and the desired pattern on an EUV mask is defined by selectively removing portions of an absorber layer ("EUV mask absorber") to uncover portions of an underlying mirror coated on a substrate, the mirror, or reflective multilayer ("ML"), generally comprising a number of alternating layers of materials having dissimilar EUV reflectivity constants.

One of the challenges in EUV lithography involves minimizing geometric defects, or the effects thereof, which may be present in a substrate surface underlying the reflective multilayer. Conventional polishing techniques employed upon conventional EUV mask blank substrate materials such as titanium silicate glasses, for example, the glass sold under the trade name ULE™ by Corning Corporation, or glass ceramics, for example, the glass sold under the trade name Zerodur™ by Scott Glass Technologies, generally are capable of reducing defects significantly. Subsequent to application of such polishing techniques, bumps, pits, and scratches sized between about 2 nanometers and about 100 nanometers may still be defined within the substrate surface.

Absent efficient techniques for substantially eliminating such remaining surface defects, their effects may be minimized by adding extra layers to the reflective multilayer. Adding layers to the multilayer, however, complicates the lithography process and increases susceptibility to other masking problems. There is a need for an efficient solution to mitigate the effects of defects defined within EUV substrate surfaces.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
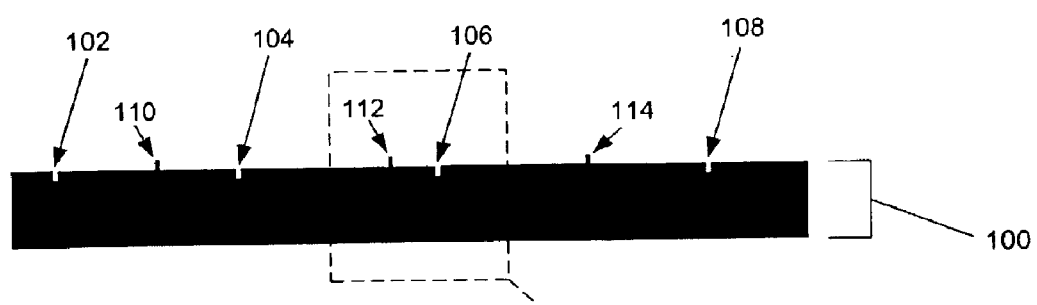
FIG. 1A depicts a cross sectional view of a substrate layer having defects.

Referring to FIG. 1A, a cross sectional view of a substrate layer (100) is depicted. The substrate layer (100), preferably comprising a material with a low defect level and a smooth surface such as glass or glass-ceramic with a low coefficient of thermal expansion ("CTE"), preferably is used as the starting material for an EUV mask. In certain cases, the substrate (100) may be formed from silicon despite the relatively large CTE of silicon, so long as heat can be removed uniformly and effectively during exposure. Other suitable substrate layer (100) materials include but are not limited to titanium silicate glasses, such as that sold under the trade name ULE™ by Corning, and glass ceramics such as that sold under the trade name Zerodur™ by Schott Glass Technologies. The substrate layer preferably has a thickness of about ¼ inch. To minimize defect geometries defined within the surface of the substrate layer, the substrate may be polished to result in a smoothed surface which generally still defines both positive defects, which protrude away from the substrate layer, and negative defects, which are defined into the surface—such as scratches or pits. Referring to FIG. 1A, the depicted substrate layer (100) has a multitude of positive defects (110, 112, 114) and negative defects (102, 104, 106, 108). While the depicted defects are substantially uniform in geometry, actual cases will have varying geometries, as would be apparent to one skilled in the art.

Figure 1B:
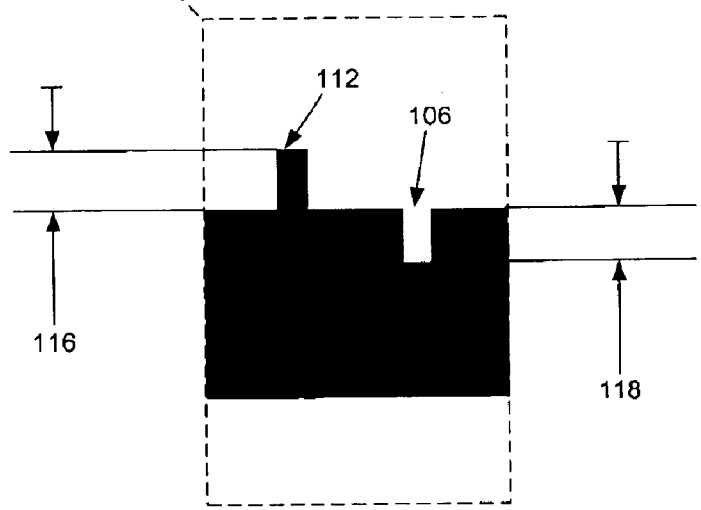
FIG. 1B depicts a close-up cross sectional view of the substrate layer of FIG. 1A.

Referring to FIG. 1B, a close-up cross sectional view of a portion of the structure of FIG. 1A is depicted to show a positive defect (112) adjacent a negative defect (106), the protrusion height (116) of the positive defect, and the depth (118) of the negative defect (106) as defined into the substrate. Subsequent to a smoothing treatment to minimize the geometries of such defects, such as a chemical mechanical polishing treatment with a conventional small particle size slurry, each of the protrusion height (116) and depth (118) preferably are less than about 100 nanometers.

Figure 2A:
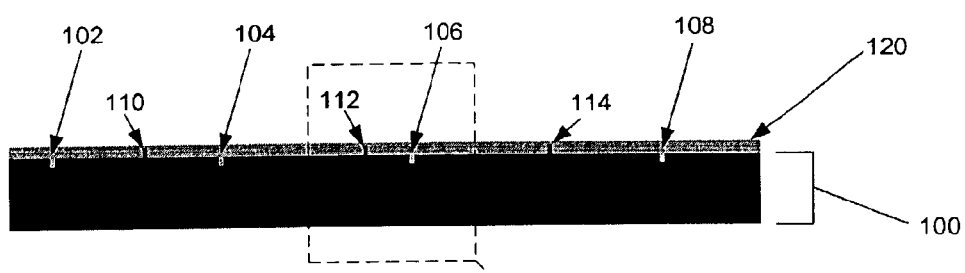
FIG. 2A depicts a cross sectional view of an embodiment of the present invention wherein a polyimide layer is formed adjacent a substrate layer having defects.
Figure 2B:
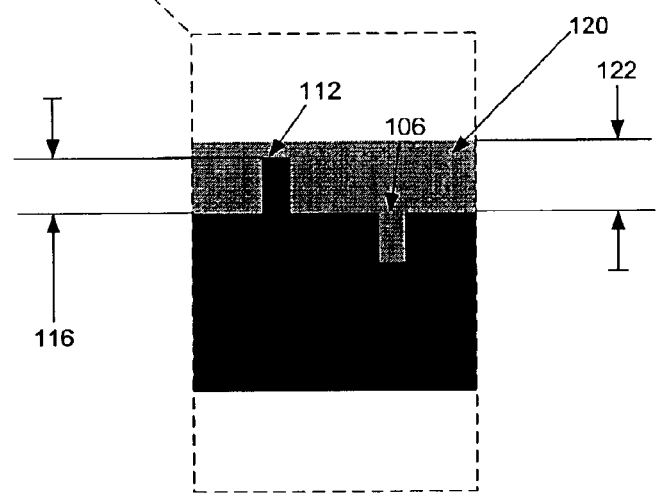
FIG. 2B depicts a close-up cross sectional view of the structures of FIG. 2A.

Referring to FIG. 2A, a structure similar to that of FIG. 1A is depicted, with the exception that a polyimide layer (120) is formed upon the substrate layer (100) to substantially infill each of the negative defects (102, 104, 106, 108), cover each of the positive defects (110, 112, 114), and provide a substantially uniform and planar surface upon which other structures may be positioned. FIG. 2B is a close up view to illustrate the infilling of a negative defect (106) and the covering of a positive defect (112) by the polyimide layer (120), which in the illustrated embodiment has a thickness (122) slightly greater than the protrusion height (116) of the positive defect (112) subsequent to curing. To provide a substantially uniform and smooth surface subsequent to curing, it is preferable that the polyimide layer (120) have a thickness after curing at least sufficient to cover the highest protruding positive defect.

Figure 3:
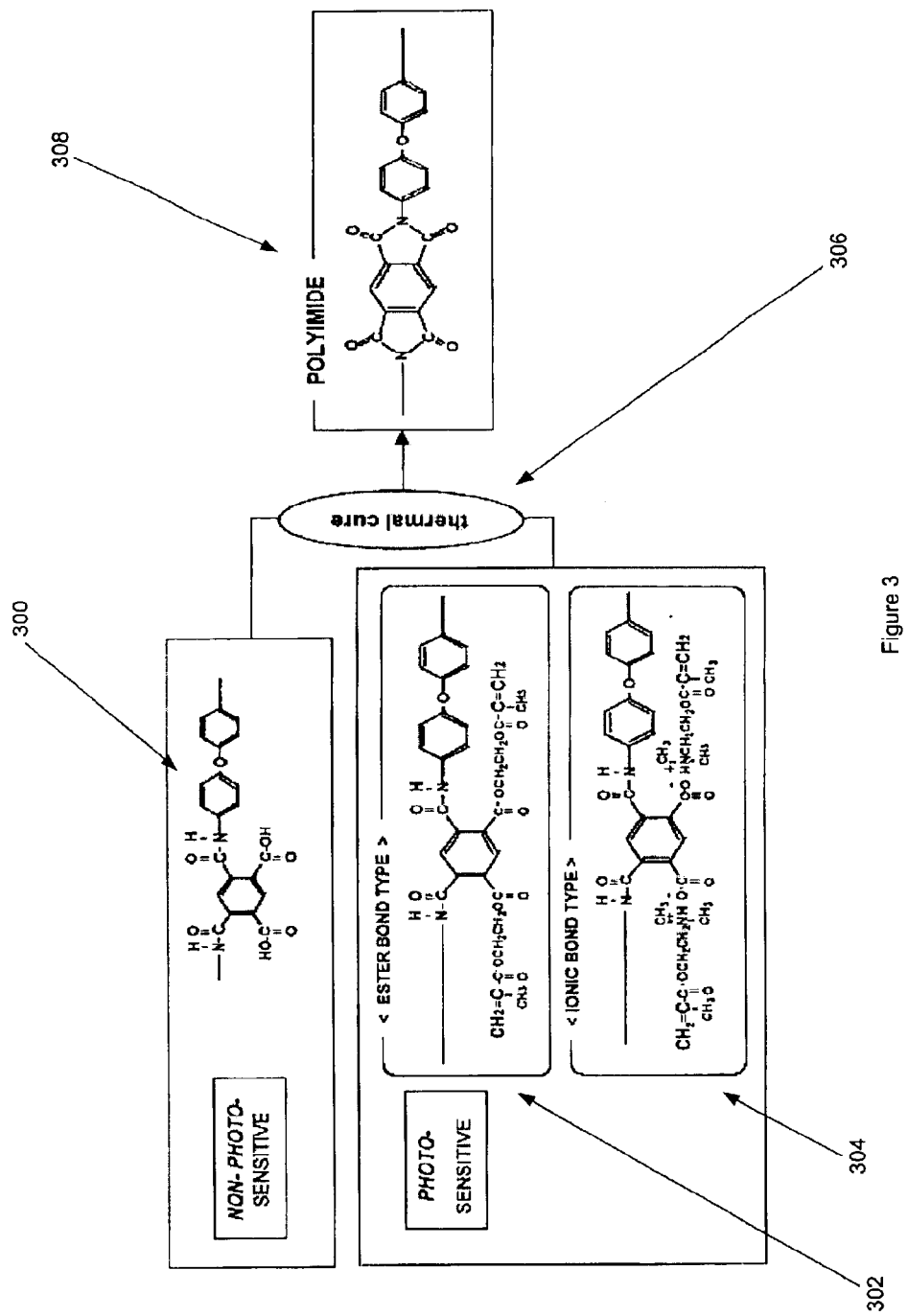
FIG. 3 depicts polyamid-type polyimide precursors which may be thermally cured to form a polyimide layer adjacent a substrate layer in accordance with various embodiments of the present invention.

To form a very thin polyimide layer (102) having a thickness in the range of about 100 nanometers, in accordance with the protrusion height (116) in the aforementioned scenario, polyimide material may be deposited in a relatively low viscosity form using conventional spin-on or spin coating techniques. Suitable polyimide precursors for very thin layer spin on are available from suppliers such as Hitachi Dupont Microsystems, Asahi Kafei, and Toray Dow Corning. For example, the suitable product sold under the trade name PI2613™ by Hitachi Dupont Microsystems is available in a N-Methyl-2-Pyrrolidone ("NMP") solvent system at about 6% solids with a viscosity of between about 130 and about 160 centistokes ("cSt"). Both polyamid and pre-imidized polyimide precursor types are suitable for use in this invention. Polyimide precursors preferably are deposited using conventional spin-on or spin coating techniques, followed by thermal curing under a vacuum to form a thin polyimide layer subsequent to curing. Polyamid type precursors preferably are cured to form a polyimide layer by heating to a temperature between about 250 and 400 degrees Celsius, while pre-imidized precursors may be cured at lower temperatures, such as around 200 degrees Celsius, as would be apparent to one skilled in the art. Polyimide precursors may be categorized as non-photosensitive or photosensitive. Referring to FIG. 3, the structures of three polyamid type precursors are depicted: a polyamic acid (300) non-photosensitive precursor, along with polyamic ester (302) and polyamic salt (304) photosensitive precursors. As noted above, each of these types of precursors may be spin-on deposited and then thermally cured (306), preferably at a temperature between about 250 and 400 degrees Celsius under a vacuum, to form a polyamide (308) layer subsequent to curing. Applied vacuum conditions are preferred during curing to prevent outgassing and improve interdigitation with the substrate surface.

Heating profiles during thermal cure (306) vary with the particular material at issue and desired film thickness, in accordance with published spin speed versus thickness curves available for various temperature profiles. For example, the supplier of the aforementioned PI2613™ product discloses that a spin speed of about 5,000 RPM for about 30 seconds, followed by a soft bake at 90 degrees Celsius for 90 seconds, another soft bake at 150 degrees Celsius, ramping from 150 degrees Celsius to 350 degrees Celsius at about 4 degrees Celsius per minute, then a curing bake at 350 degrees Celsius for 30 minutes and subsequent cool down to ambient, results in a polyimide layer of about 150 nanometers thickness, with thinner layers available with longer spin times before curing.

Figure 4:
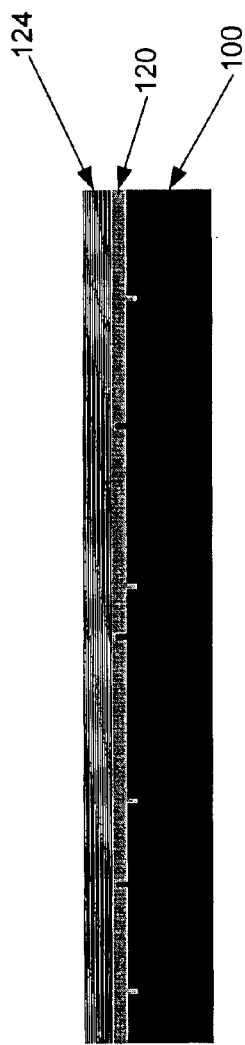
FIG. 4 depicts a cross sectional view of various aspects of the present invention wherein a polyimide layer is formed between a substrate layer and a reflective multilayer.

Referring to FIG. 4, subsequent to curing the polyimide layer (120), a reflective multilayer may be formed adjacent the polyimide layer (120) using conventional techniques. The reflective multilayer (124) preferably comprises about 20–80 pairs of alternating layers of a high index of refraction material and a low index of refraction material. As would be apparent to one skilled in the art, a high index of refraction material includes elements with high atomic number which tend to scatter EUV light, and a low index of refraction material includes elements with low atomic number which tend to transmit EUV light. The choice of materials for the reflective multilayer (124) depends upon the illumination wavelength ("lambda"). To a first approximation, each layer has a thickness of about one quarter of lambda. More specifically, the thickness of the individual layers depends on the illumination wavelength, lambda, and the incidence angle of the illumination light. For EUV, the wavelength is about 13.4 nm and the incidence angle is about 5 degrees. The thicknesses of the alternating layers are tuned to maximize the constructive interference of the EUV light reflected at each interface and to minimize the overall absorption of the EUV light. The reflective multilayer (124) preferably can achieve about 60–75% reflectivity at the peak illumination wavelength. In one embodiment, the reflective multilayer (124) comprises about 40 pairs of alternating layers of a high index of refraction material and a low index of refraction material. For example, each high index of refraction layer may be formed from about 2.8 nanometer thick molybdenum while each low index of refraction material may be formed from about 4.2 nanometer thick silicon. In another embodiment, the reflective multilayer (124) may comprise alternating layers of molybdenum and beryllium or other known pairings of suitable materials. For example, about 70 pairs of molybdenum/beryllium bilayers, each of which has a thickness of about 5.8 nanometers, about 40% of the bilayer thickness being molybdenum and the remaining 60% of the bilayer thickness being beryllium, may be utilized as a reflective multilayer (124).

The reflective multilayer (124) preferably is formed over the substrate (100) using ion beam deposition or DC magnetron sputtering. The thickness uniformity preferably is better than 0.8% across the substrate (100). Ion beam deposition may result in less perturbation and fewer defects in the upper surface of the reflective multilayer (124) because the deposition conditions usually may be optimized to smooth over any defect on the substrate layer (100). DC magnetron sputtering may be more conformal, thus producing better thickness uniformity, but substrate (100) defect geometry tends to propagate up through the alternating layers to the upper surface of the reflective multilayer (124).

Figure 5A:
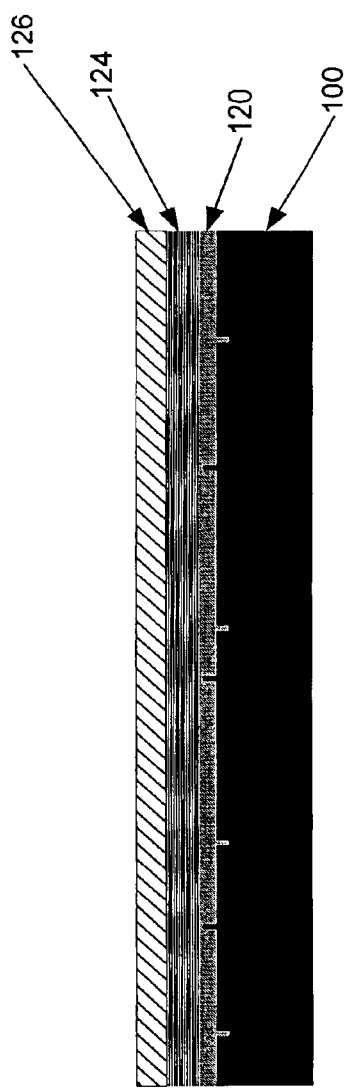
FIG. 5A depicts a cross sectional view of an EUV mask blank in accordance with one embodiment of the present invention.

Referring to FIG. 5A, an EUV mask absorber layer (126) may be formed adjacent the reflective multilayer (124). The mask absorber layer (126) preferably comprises a material such as tantalum nitride, tantalum oxynitride, and/or chromium which etches controllably to enable subsequent formation of trenches having very tight geometric tolerances and provides sufficient EUV irradiation exposure modification when formed into a layer of sufficient thickness, the requisite thickness varying with the selected mask absorber materials. Preferably the mask absorber layer (126) has a thickness less than about 150 nanometers and is formed using conventional techniques such as physical or chemical vapor deposition, or plasma enhanced chemical vapor deposition.

The combination of a substrate layer (100), polyimide layer (120), reflective multilayer (124), and mask absorber layer (126) may be termed an EUV "mask blank" (50) which may be further processed to form an EUV mask.

Figure 5B:
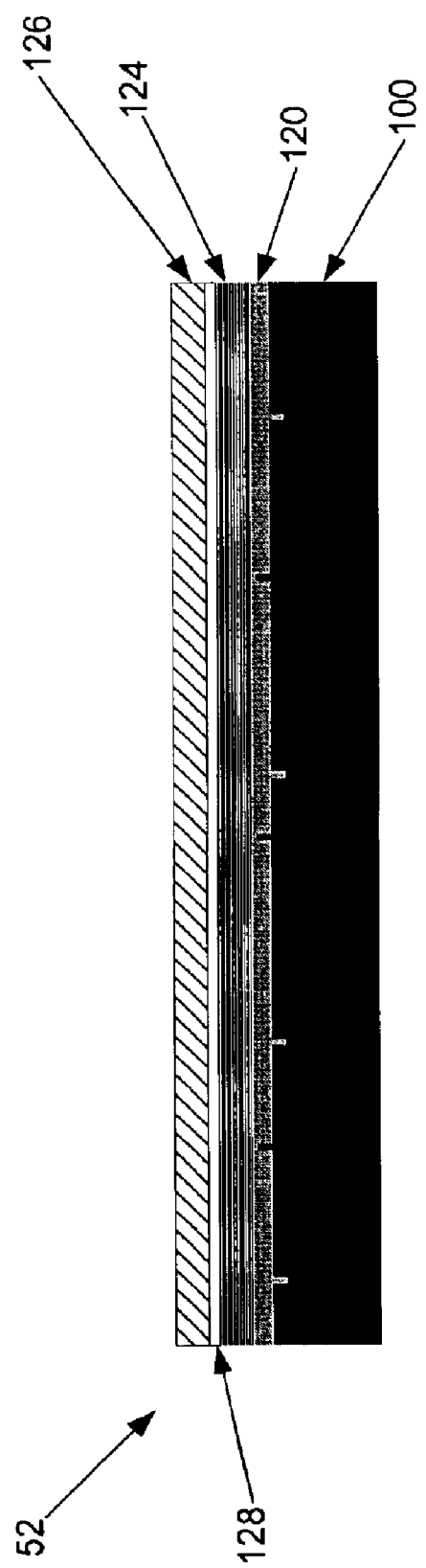
FIG. 5B depicts a cross sectional view of an EUV mask blank in accordance with one embodiment of the present invention.

Referring to FIG. 5B, a structure, or mask blank (52), similar to that of FIG. 5A is depicted, with the exception that in the structure of FIG. 5B a protective layer (128) is disposed between the reflective multilayer (124) and mask absorber layer (126). Such a protective layer (128) may be formed before formation of the mask absorber layer (126) to protect the reflective multilayer (124) from oxidation or etching chemistries utilized during subsequent patterning and repair treatments associated with the mask absorber layer. Suitable protective layer materials include but are not limited to silicon, preferably about 11 nanometers thick and deposited along with the other silicon layers of the preferred reflective multilayer (124), silicon dioxide or silicon oxynitride deposited using conventional techniques such as physical or chemical vapor deposition or plasma enhanced chemical vapor deposition at a thickness of about 40–60 nanometers to protect underlying multilayer (124) materials from focused ion beam repair, or ruthenium, deposited at a thickness between about 2 nanometers and about 6 nanometers using the techniques for forming the aforementioned reflective multilayer (124), or other conventional techniques such as physical or chemical vapor deposition, or plasma enhanced chemical vapor deposition. Copending U.S. patent applications entitled "High Performance EUV Mask" and "Double-Metal EUV Mask Absorber", assigned to the same assignee as the present invention, further describe the use of such protective layer materials, along with the aforementioned mask absorber layer (126) materials. The term "protective layer" utilized herein is in reference to layers also known as "buffer layers" or "capping layers".

Figure 6:
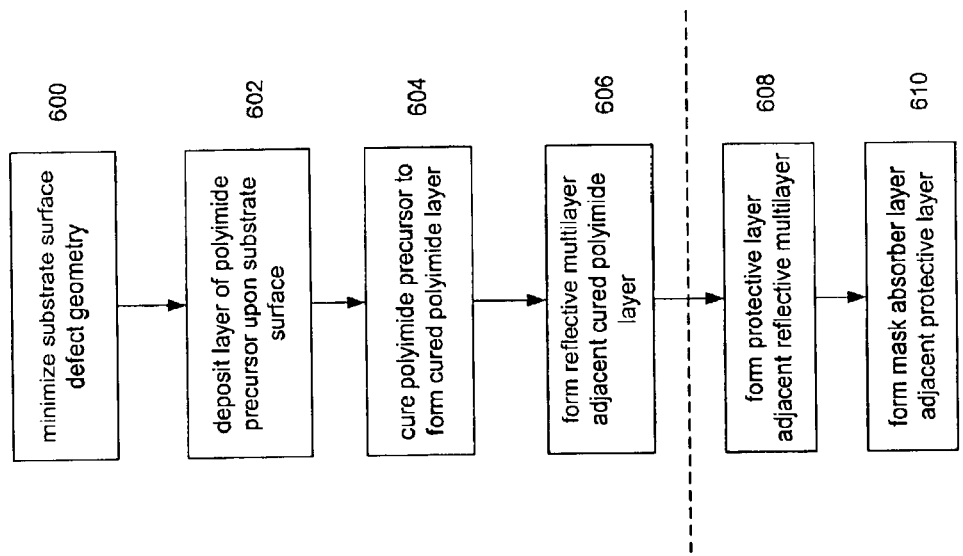
FIG. 6 depicts a flow chart illustrating forming an EUV mask in accordance with one embodiment of the present invention.

Referring to FIG. 6, a method to form an EUV mask in accordance with the techniques described herein is depicted in flowchart fashion. As described above, subsequent to minimizing substrate surface defect geometry (600) utilizing techniques such as polishing, a layer of polyimide precursor material is deposited upon the substrate (602), preferably using spin-on techniques, subsequent to which a thermal curing treatment forms a cured polyimide layer (604) from the polyimide precursors. As noted above, the thermal curing treatment (604) preferably is conducted in a vacuum to prevent outgassing and improve interdigitation with the substrate surface. Subsequent to forming a cured polyimide layer (604), a reflective multilayer may be formed (606) adjacent the cured polyimide layer. Further, protective (608) and mask absorber (610) layers may be formed adjacent the reflective multilayer and protective layer, respectively.

Each of the structures of FIGS. 5A and 5B are improved by the substrate-defect-mitigating polyimide layer (120), which limits propagation of positive and negative defects to subsequently formed layers, and therefore enables a more uniform and precise EUV mask. Thus, a novel substrate defect mitigation solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. An EUV mask structure comprising:
   a substrate layer;
   a reflective multilayer;
   a polyimide layer between the substrate layer and reflective multilayer.

2. The EUV mask structure of claim 1 further comprising a mask absorber layer adjacent the reflective multilayer.

3. The EUV mask structure of claim 1 wherein the substrate layer comprises a silicate glass or glass ceramic.

4. The EUV mask structure of claim 3 wherein the substrate layer comprises positive and negative defects, wherein the positive defects protrude away from the substrate layer by less than about 100 nanometers, and the negative defects are defined into the substrate layer by less than about 100 nanometers.

5. The EUV mask structure of claim 1 wherein the reflective multilayer comprises about 40 pairs of alternating layers of molybdenum and silicon having thicknesses of about 2.8 nanometers and about 4.2 nanometers, respectively.

6. The EUV mask structure of claim 1 wherein the reflective multilayer comprises about 70 pairs of alternating layers of molybdenum and beryllium, each pair having a thickness of about 5.8 nanometers, wherein 40% of said thickness is molybdenum and about 60% of said thickness is beryllium.

7. The EUV mask structure of claim 4 wherein the polyimide layer has a thickness sufficient to cover the highest positive defects.

8. The EUV mask structure of claim 7 wherein the polyimide layer substantially completely infills each of the negative defects.

9. The EUY mask structure of claim 2 wherein the mask absorber layer comprises a material selected from the group consisting of tantalum nitride, tantalum oxynitride, and chromium.

10. The EUV mask structure of claim 2 further comprising a protective layer positioned between the reflective multilayer and the mask absorber layer.

11. The EUV mask structure of claim 10 wherein the protective layer comprises a material selected from the group consisting of ruthenium, silicon dioxide, and silicon oxynitride.

12. A method to form an EUV mask structure comprising:
   minimizing defect geometry defined by a substrate surface;
   depositing a layer of polyimide precursor material upon the substrate surface;
   curing the polyimide precursor material to form a cured polyimide layer;
   forming a reflective multilayer adjacent the cured polyimide layer.

13. The method of claim 12 wherein minimizing defect geometry comprises polishing the substrate surface.

14. The method of claim 12 wherein depositing a layer of polyimide precursor material comprises spin coating the polyimide precursor material upon the substrate surface.

15. The method of claim 12 wherein curing the polyimide precursor material comprises heating the polyimide precursor material to a temperature between about 250 and about 400 degrees Celsius.

16. The method of claim 12 further comprising applying a vacuum before and during curing the polyimide precursor material.

17. The method of claim 13 wherein the substrate surface defines positive defects after polishing extending away from the substrate surface by less than about 100 nanometers.

18. The method of claim 17 wherein the cured polyimide layer covers the positive defects.

19. The method of claim 12 further comprising forming a protective layer adjacent the reflective multilayer.

20. The method of claim 12 further comprising forming a mask absorber layer adjacent the reflective multilayer.

* * * * *